United States Patent [19]

Orihara et al.

[11] 4,259,727
[45] Mar. 31, 1981

[54] MAGNETIC BUBBLE MEMORY DEVICE

[75] Inventors: Shobu Orihara; Seiichi Iwasa; Ryoichi Kinoshita, all of Kawasaki, Japan

[73] Assignee: Fujitsu Limited, Tokyo, Japan

[21] Appl. No.: 52,317

[22] Filed: Jun. 26, 1979

[30] Foreign Application Priority Data

Jun. 30, 1978 [JP] Japan .................................. 53-79889
Aug. 14, 1978 [JP] Japan .................................. 53-98762

[51] Int. Cl.³ ........................................... G11C 19/08
[52] U.S. Cl. ........................................ 365/16; 365/12
[58] Field of Search ............................ 365/15, 16, 12

[56] References Cited

U.S. PATENT DOCUMENTS

4,125,875  11/1978  Saito ...................................... 365/15

Primary Examiner—James W. Moffitt
Attorney, Agent, or Firm—Staas and Halsey

[57] ABSTRACT

A magnetic bubble memory device which comprises special minor loops for storing address information regarding spare minor loops corresponding to defective regular minor loops. The structure of the bubble transfer or reproducing gates corresponding to said special minor loops is different from that corresponding to ordinary minor loops.

9 Claims, 8 Drawing Figures

MAGNETIC BUBBLE MEMORY DEVICE

BACKGROUND OF THE INVENTION

The present invention relates to a magnetic bubble memory device having a major-minor loop structure, and more particularly to a device of the above-mentioned type which provide a means for storing information regarding of defective minor loops.

As a prior art method for solving the problem of defective minor loops in a magnetic bubble memory device having a major-minor loop structure, the following method has been proposed. That is, some loops are chosen as the reserve minor loops from a plurality of minor loops, the address information of the defective minor loops is stored in an external semiconductor fixed memory device, i.e. ROM (See "Electronics" Aug. 4, 1977, Page 85). When an access for writing information into a defective minor loop or an access for reading information from a defective minor loop occurs, a reserve minor loop receives an access after an address conversion is effected by means of the external semiconductor fixed memory device. This prior art method, however, is disadvantageous in that the entire magnetic bubble device becomes large in size and complicated in structure, because of the existence of the external semiconductor fixed memory device.

Another prior art method for solving the above mentioned problem has been proposed in which a special minor loop for storing the information regarding defective minor loops and a special bubble transfer gate solely for said special minor loop are used, and an access to the information regarding defective minor loops is effected through said special bubble transfer gate (See "Electronics", Aug. 17, 1978, Pages 39 and 40). This prior art method, however, is also disadvantageous in that, since it is necessary to provide the special bubble transfer gate solely for said special minor loop, and said special bubble transfer gate requires an installation of a conductor and a terminal for said special bubble transfer gate, the structure of the magnetic bubble memory device becomes complicated.

The present invention has been invented to avoid the above described disadvantages in the prior art devices and to introduce a novel structure of a magnetic bubble memory device having means for dealing with the problems of writing information into and reading information from a defective minor loop.

SUMMARY OF THE INVENTION

The principal object of the present invention is to enable the selective writing of information into and the selective reading of information from either regular minor loops or spare minor loops, in accordance with the information stored in special minor loops, with the aid of special operations of bubble transfer gates.

DESCRIPTION OF THE PREFERRED EMBODIMENTS

Figure 1:
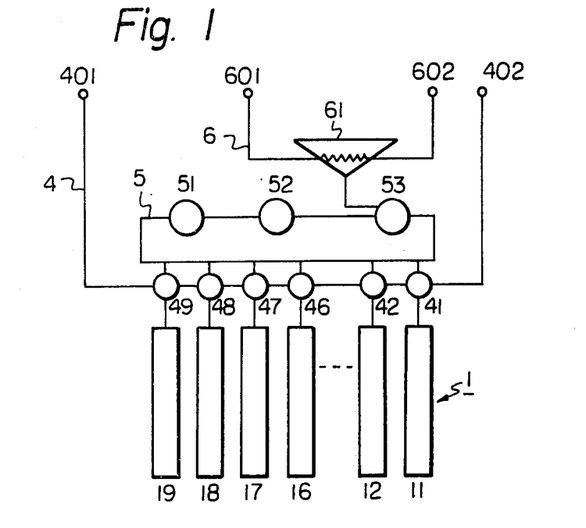
FIG. 1 is an illustration of a magnetic bubble memory device of the major-minor loop type as an embodiment of the present invention.
Figure 2A:
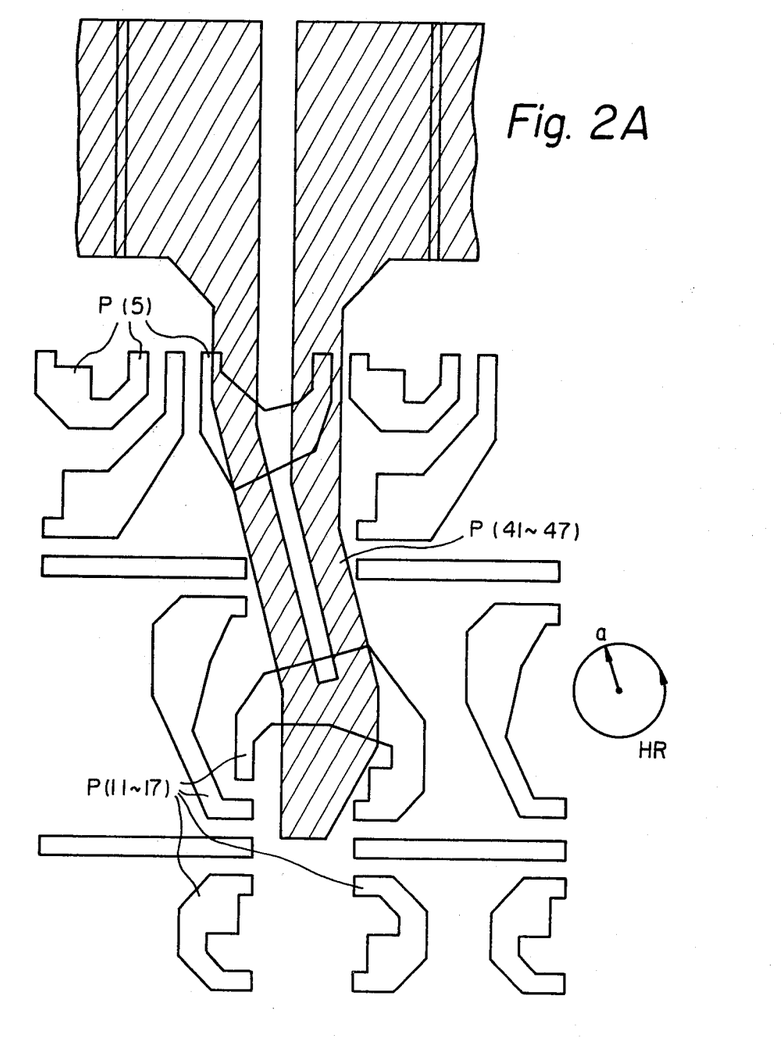
FIG. 2A is an illustration of the structure of bubble transfer gates 41 through 47 in FIG. 1 for ordinary minor loops.
Figure 2B:
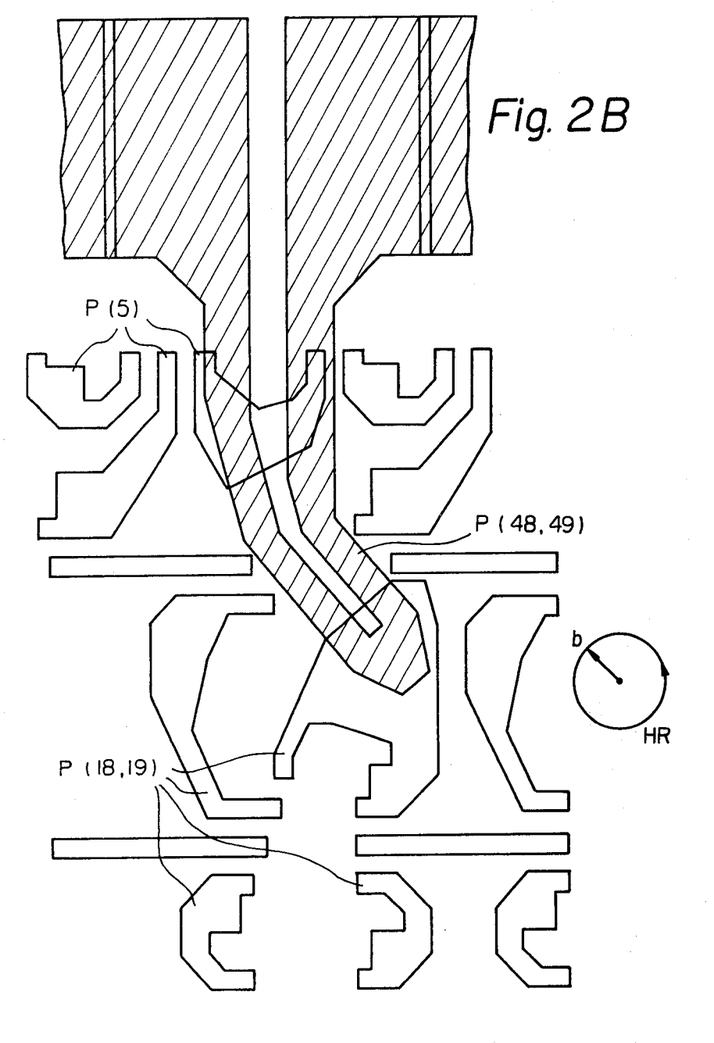
FIG. 2B is an illustration of the structure of bubble transfer gates 48 and 49 in FIG. 1 for defective minor loops.

A magnetic bubble memory device as an embodiment of the present invention is illustrated in FIGS. 1, 2A and 2B. The bubble memory device comprises a major loop 5 and a minor loop group 1. The major loop 5 includes a bubble generator 51, a bubble extinguisher 52 and a bubble replicating gate 53. The minor loop group 1 consists of, for example, nine minor loops 11, 12, ..., 19. An output of the bubble replicating gate 53 is connected to a bubble detector 61, to which an electric current is supplied through a conductive pattern 6 connected between terminals 601 and 602. A sequence of bubble transfer gates 41, 42, ..., 49 of the single conduction pattern type (as shown by the cross hatching in the figures) is provided between the major loop 5 and the minor loop group 1 for controlling the transmission of bubbles. Electric current is supplied to bubble transfer gates 41, 42, ..., 49 through the conductive pattern 4 connected between terminals 401 and 402.

The seven minor loops 11 through 17 out of the nine minor loops form the ordinary information storage region, consisting of the regular minor loops and the spare minor loops. If a regular minor loop is defective, the information stored in said regular minor loop is transferred to a spare minor loop and the address information of the spare minor loop corresponding the defective regular minor loop is stored in the special minor loops 18 and 19.

The structure of the bubble transfer gates 41 through 47 corresponding to ordinary minor loops 11 through 17 is different from that of the bubble transfer gates 48 and 49 corresponding to the special minor loops 18, 19. This difference in structure of the bubble transfer gates enables the selective transfer of bubbles between the major loop 5 and the two kinds of minor loops, i.e. the ordinary minor loops 11 through 17 and the special minor loops 18 and 19.

An example of the structures of bubble transfer gates 41 through 47 and bubble transfer gates 48 and 49 is illustrated in FIGS. 2A and 2B. The patterns P(5) of the major loop, the patterns P(11-17) of the ordinary minor loops, the patterns P(18,19) of the special minor loop, the conductive patterns P(41-47) of the bubble transfer gates corresponding to the ordinary minor loops, and the conductive patterns P(48,49) of the bubble transfer gates corresponding to the special minor loops are illustrated in FIGS. 2A and 2B. The conductive patterns P(41-47) and P(48,49) of the bubble transfer gates are arranged to span the patterns P(5) of the major loop and the patterns P(11-17), P(18,19) of the minor loop. The shapes of the pattern of the minor loop and the conductive pattern of the bubble transfer gate corresponding to the ordinary minor loops 11-17, as shown in FIG. 2A, are different from the shapes of the pattern of the minor loop and the conductive pattern of the bubble transfer gate corresponding to the special minor loops 18, 19, as shown in FIG. 2B. Because of this difference in the shapes of the patterns, the transmission of bubbles is possible only when the direction of the rotating magnetic field HR is "a" in FIG. 2A, while the transmission of bubbles is possible only when the direction of the rotating magnetic field HR is "b" in FIG. 2B.

The process of writing address information regarding a spare minor loop corresponding to a defective minor loop into the special minor loops 18, 19 will now be explained. A sequence of bubbles representing address information regarding a spare minor loop corresponding to a defective minor loop is generated in the bubble generator 51, and then, transferred through the major loop 5 to the bubble transfer gates 41 through 49, which correspond to the minor loops 11 through 19. If electric current is supplied to the conductive pattern 4 at the moment the direction of the rotating magnetic field HR is "b", as shown in FIG. 2B, the sequence of bubbles reaching the bubble transfer gates is transferred only to the special minor loop 18, 19 through the bubble transfer gates 48, 49, but is not transferred to the ordinary minor loops 11 through 17. Thus, the selective transfer of address information regarding defective minor loops to the special minor loops 18, 19 is achieved. In a similar manner the selective transfer of address information regarding defective minor loops stored in the special minor loop 18, 19 to the major loop 5 through the bubble transfer gates 48, 49 is achieved.

After the above described process, the writing of the information into or the reading of the information from the ordinary minor loops 11 through 17 is effected with the aid of the address information regarding a spare minor loop corresponding to a defective minor loop which has been transferred to the major loop 5 from the special minor loops 18, 19. If electric current is supplied to the conductive pattern 4 at the moment the direction of the rotating magnetic field HR is "a", as shown in FIG. 2A, the transfer of the information from the major loop 5 to the ordinary minor loops 11 through 17 or from the ordinary minor loops 11 through 17 to the major loop 5 is effected, but the transfer of information between the major loop 5 and the special minor loop 18, 19 is prevented. Thus, the selective transfer of the ordinary information between the major loop 5 and the ordinary minor loops 11 through 17 is achieved.

Another magnetic bubble memory device as another embodiment of the present invention is illustrated in FIGS. 3, 4A, 4B, 5A and 5B. In this embodiment, the major loop consists of two elements, i.e. the "write" major loop element 2 and the "read" major loop element 3, the bubble transfer gates 21, 22, . . . , 29 of the single conductive pattern type shown in the figures are arranged between the write major loop element 2 and the minor loop group 1, and the bubble replication gates 31, 32, . . . , 39 of the single conductive pattern type; are arranged between the read major loop element 3 and the minor loop group 1. Electric current is supplied to the bubble transfer gates 21 through 29 through the conductive pattern 20 connected between the terminals 201 and 202. Also, electric current is supplied to the bubble replicating gates 31 through 39 through the conductive pattern 30 connected between the terminals 301 and 302. The read major loop element 3 is connected to a bubble detector 61 to which electric current is supplied through a conductive pattern 6 connected between the terminals 601 and 602.

Figure 3:
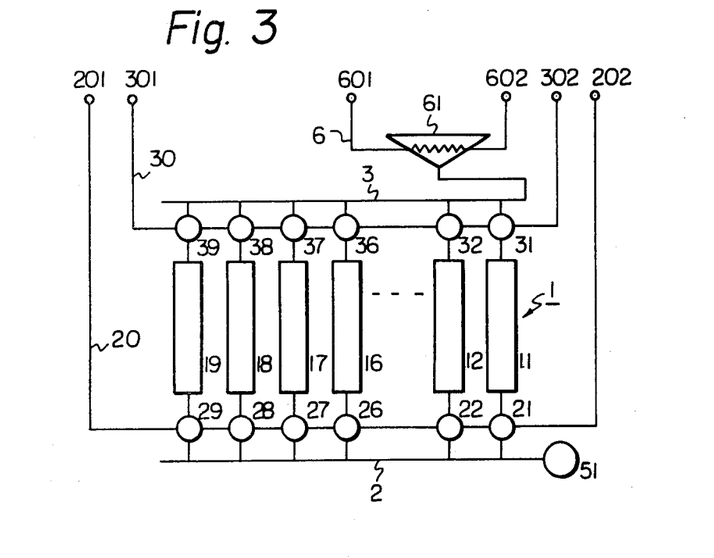
FIG. 3 is an illustration of a magnetic bubble memory device of the major-minor loop type as another embodiment of the present invention.
Figure 4A:
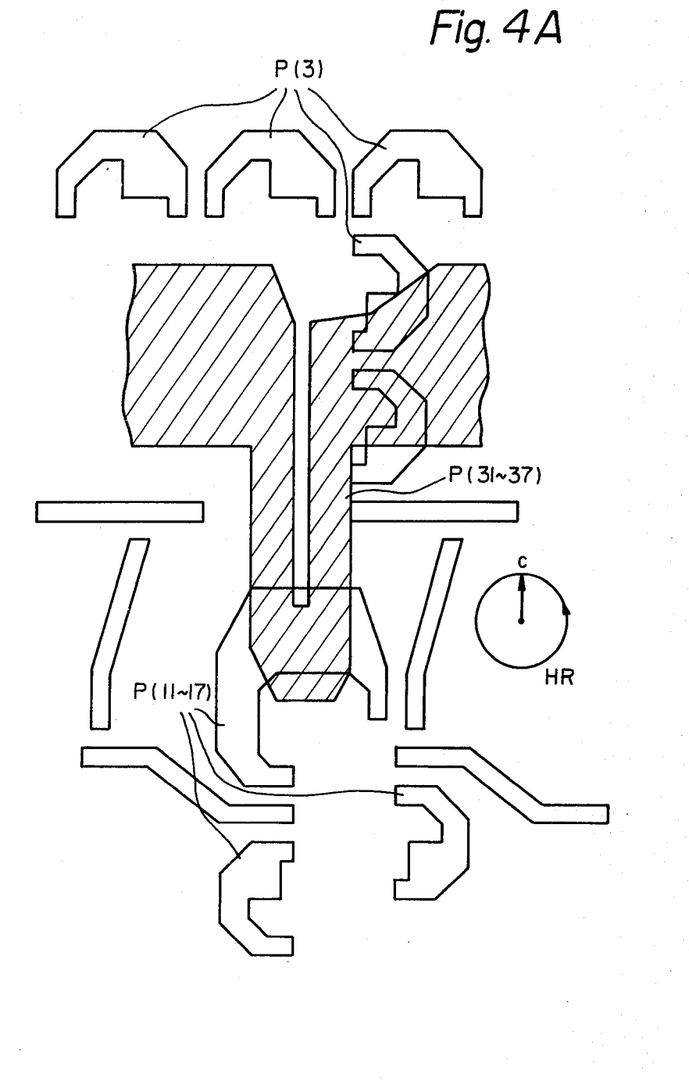
FIG. 4A is an illustration of the structure of bubble transfer gates 31 through 37 corresponding to the "read" major loop in FIG. 3 for ordinary minor loops.
Figure 4B:
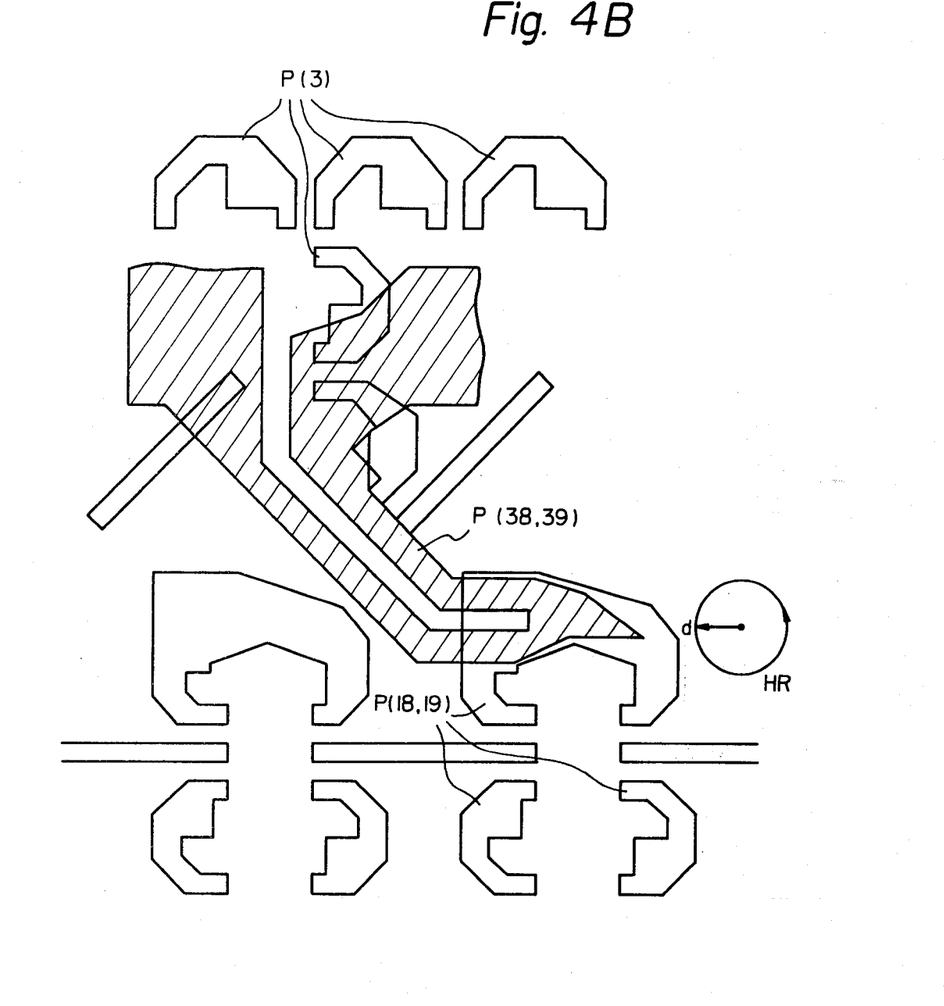
FIG. 4B is an illustration of the structure of bubble transfer gates 38 and 39 corresponding to the "read" major loop in FIG. 3 for defective minor loops.
Figure 5A:
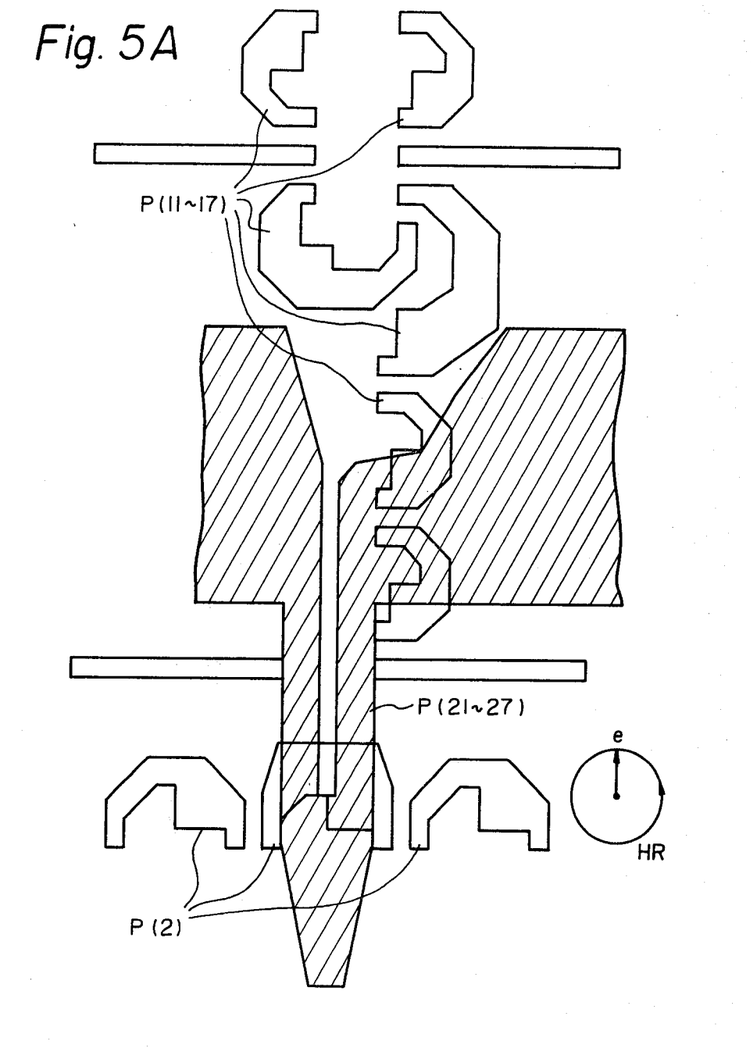
FIG. 5A is an illustration of the structure of bubble transfer gates 21 through 27 corresponding to the "write" major loop in FIG. 3 for ordinary minor loops.
Figure 5B:
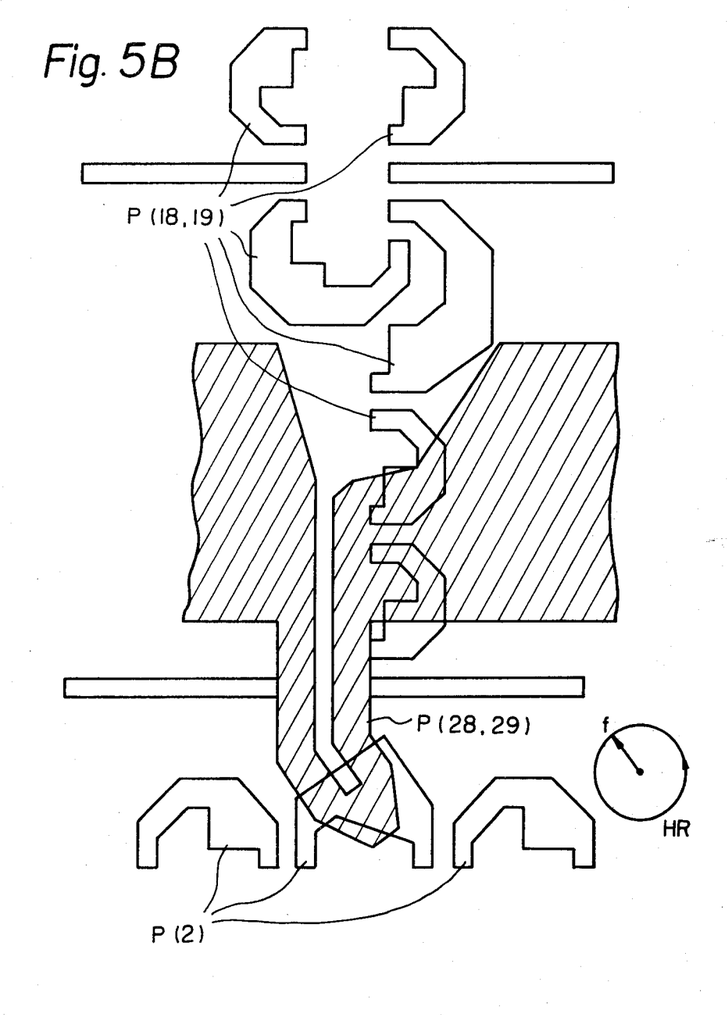
FIG. 5B is an illustration of the structure of bubble transfer gates 28 and 29 corresponding to the "write" major loop in FIG. 3 for defective minor loops.

Similar to the embodiment shown in FIG. 1, nine minor loops 11, 12, . . . , 19 consist of seven ordinary minor loops 11 through 17 and two special minor loops 18 and 19 in the embodiment shown in FIG. 3.

Similar to the embodiment shown in FIG. 1, the structures of the bubble replicating gates 31 through 37 and the bubble transfer gates 21 through 27 corresponding to the ordinary minor loops 11 through 17 are different from those of the bubble replicating gate 38, 39 and the transfer gates 28, 29 corresponding to the special minor loops 18, 19 in the embodiment shown in FIG. 3. Accordingly, similar to the embodiment shown in FIG. 1, the selective transfer of information between the major loop 2, 3 and the minor loops 11 through 19 is achieved in accordance with the difference in the structures of the bubble replicating gates and the bubble transfer gates in the embodiment shown in FIG. 3.

An example of the structures of the bubble replicating gates 31 through 37 (FIG. 4A), 38, 39 (FIG. 4B), the bubble transfer gates 21 through 27 (FIG. 5A), and 28, 29 (FIG. 5B) is illustrated in FIGS. 4A through 5B. The patterns P(2) of the write major loop, the patterns P(3) of the read major loop, the patterns P(11-17) of the ordinary minor loops 11 through 17, the patterns P(18,19) of the special minor loops 18, 19, the conductive patterns P(21-27) of the bubble transfer gates 21 through 27, the conductive patterns P(28,29) of the bubble transfer gates 28, 29, the conductive patterns P(31-37) of the bubble replicating gates 31 through 37 and the conductive patterns P(38,39) of the bubble replicating gates 38 and 39 are illustrated in FIGS. 4A through 5B.

Because of the difference in the shapes of the patterns, the transmission of bubbles is possible in each of the FIGS. 4A through 5B only when the direction of the rotating magnetic field is as follows. That is, the direction is "c" in FIG. 4A, the direction is "d" in FIG. 4B, the direction is "e" in FIG. 5A and the direction is "f" in FIG. 5B.

The operation of this embodiment illustrated in FIGS. 3 through 5B will be easily understood by referring to the description of the operation of the embodiment illustrated in FIGS. 1 through 2B.

What we claim is:
1. A magnetic bubble memory device comprising
a plurality of minor loops for storing information
at least one major line for selectively writing information into and reading information from said plurality of minor loops,
said plurality of minor loops comprising regular minor loops, spare minor loops to store the information intended for any defective one of said regular minor loops, and at least one special minor loop for storing address information regarding the spare minor loops corresponding to the defective regular minor loops,
a plurality of bubble gates between said minor loops and said major line, and,
the structure of said bubble gates between said special minor loops and the major line being different from that between the ordinary minor loops and the major line to selectively transfer the information between said special minor loops and the major line and between the ordinary minor loops and the major line, such that no information transfer occurs between the special minor loops and the major line during the time that information transfer occurs between the ordinary minor loops and the major loop and conversely, no information transfer between the ordinary minor loops and the major line occurs when information is transferred between the special minor loops and the major line.

2. The device of claim 1, said major line comprising a part of a major loop.

3. The device of claim 2, said device comprising a bubble detector, said major loop comprising a bubble generator, a bubble extinguisher, a bubble gate connecting from said major line to said bubble detector for allowing said bubble detector to provide an output in correspondence to the bubbles in said major loop.

4. The device of claim 3, said bubble gates between said major loop and said minor loop comprising bubble transfer gates.

5. The device of claim 3, said bubble gate between said major line and said bubble detector comprisng a bubble replicating gate.

6. The device of claim 1, comprising at least two of said major lines connected to each said minor loop at different respective points of each said minor loop, a first one of said major lines being connected to a bubble detector and the second one of said major lines being connected to a bubble generator.

7. The device of claim 6, said bubble gates connecting said minor loops to said first major line comprising bubble replication gates, and said bubble gates connecting said minor loops to said second major line comprising bubble transfer gates.

8. The device of claims 1, 2, 3, 4, 5, 6 or 7 each said bubble gate being of the single conductive pattern type.

9. The device of claims 1, 2, 3, 4, 5, 6 or 7, each said bubble gate being of the single conductive pattern type, and each said bubble gate connected to one of said special minor loops having a portion of said single conductive pattern that is not aligned parallel to any portion of said single conductive pattern of said type of bubble gates connected to said ordinary minor loops.

* * * * *

UNITED STATES PATENT AND TRADEMARK OFFICE
CERTIFICATE OF CORRECTION

PATENT NO. : 4,259,727

DATED : March 31, 1981

INVENTOR(S) : Orihara et al.

It is certified that error appears in the above—identified patent and that said Letters Patent is hereby corrected as shown below:

```
[57] In the Abstract, line 6, "reproducing" should be
     --replicating--.
Column 1, line 10, after "regarding" delete "of".
Column 2, line 44, after "corresponding" insert --to--.
Column 3, line 60, "replication" should be --replicating--;
         line 61, after "type" delete ";".
Column 4, line 13, "gate" should be --gates--;
         line 18, "loop" should be --loops--.
Column 6, line 2, "comprisng" should be --comprising--;
         line 12, "replication" should be --replicating--;
         line 15, after "7" insert --,--.
```

Signed and Sealed this

Eleventh Day of August 1981

[SEAL]

Attest:

Attesting Officer

GERALD J. MOSSINGHOFF

Commissioner of Patents and Trademarks